(12) United States Patent
Tomomatsu et al.

(10) Patent No.: US 8,950,321 B2
(45) Date of Patent: Feb. 10, 2015

(54) SCREEN PRINTING DEVICE AND SCREEN PRINTING METHOD

(75) Inventors: Michinori Tomomatsu, Yamanashi (JP);
Yuuji Ootake, Yamanashi (JP);
Toshiyuki Murakami, Yamanashi (JP);
Minoru Murakami, Yamanashi (JP);
Akira Maeda, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/990,834

(22) PCT Filed: Jul. 24, 2012

(86) PCT No.: PCT/JP2012/004724
§ 371 (c)(1),
(2), (4) Date: May 31, 2013

(87) PCT Pub. No.: WO2013/014925
PCT Pub. Date: Jan. 31, 2013

(65) Prior Publication Data
US 2013/0239830 A1    Sep. 19, 2013

(30) Foreign Application Priority Data
Jul. 25, 2011   (JP) .................. 2011-161683

(51) Int. Cl.
*B05C 17/04*   (2006.01)
*B41L 13/18*   (2006.01)
(Continued)

(52) U.S. Cl.
CPC .............. *B41F 15/42* (2013.01); *H05K 3/1233* (2013.01); *B41F 15/0881* (2013.01); *B41F 15/36* (2013.01); *H05K 3/3484* (2013.01); *B41P 2215/50* (2013.01)

USPC ........................... 101/123; 101/126; 101/129

(58) Field of Classification Search
CPC . B41F 15/0818; B41F 15/085; H05K 3/1216; H05K 3/1233
USPC ....................... 101/123, 124, 126, 127.1, 129
See application file for complete search history.

(56) References Cited

U.S. PATENT DOCUMENTS 6,237,490 B1     5/2001  Takahashi et al.
6,775,899 B1 *   8/2004  Tomomatsu et al. ........... 29/593

(Continued)

FOREIGN PATENT DOCUMENTS

CN    1200186 A    11/1998
JP    06-79537 A   11/1994

(Continued)

OTHER PUBLICATIONS

International Search Report for PCT/JP2012/004724 dated Aug. 21, 2012.

(Continued)

*Primary Examiner* — Ren Yan
(74) *Attorney, Agent, or Firm* — Pearne & Gordon LLP (57) ABSTRACT

At the two ends of a pair of clamping members (9a) which sandwich and clamp a board (10) from the Y direction, mask supporting members (9b) forming a rectangle frame are disposed, and a screen mask (12) is supported from below by the mask supporting members (9b) in a state that the board (10) abuts against the under surface of the screen mask (12). A downwards bending of the screen mask (12) can be prevented, and the time and labor of maintenance can be decreased by preventing the deposits of paste on the screen mask (12) that occur due to the bending.

2 Claims, 5 Drawing Sheets (51) Int. Cl.
  *B41F 15/42* (2006.01)
  *H05K 3/12* (2006.01)
  *B41F 15/08* (2006.01)
  *B41F 15/36* (2006.01)
  *H05K 3/34* (2006.01)

(56) References Cited

U.S. PATENT DOCUMENTS

| 7,225,732 | B2* | 6/2007 | Sakaue et al. | 101/127.1 |
| 7,281,472 | B2* | 10/2007 | Sakaue et al. | 101/129 |
| 2001/0017086 | A1 | 8/2001 | Takahashi et al. | |
| 2002/0178943 | A1 | 12/2002 | Takahashi et al. | |
| 2005/0252395 | A1 | 11/2005 | Sakaue et al. | |
| 2010/0242754 | A1 | 9/2010 | Nishi et al. | |
| 2011/0132212 | A1* | 6/2011 | Kondo et al. | 101/123 |

FOREIGN PATENT DOCUMENTS

| JP | 2003-220687 A | 8/2003 |
| JP | 2005-324492 A | 11/2005 |
| JP | 2005-324493 A | 11/2005 |
| JP | 2008-162129 A | 7/2008 |
| JP | 2010-234627 A | 10/2010 |

OTHER PUBLICATIONS

Chinese Office Action for Application No. 201280004246.5 dated Sep. 17, 2014.

* cited by examiner

SCREEN PRINTING DEVICE AND SCREEN PRINTING METHOD

TECHNICAL FIELD

The present invention relates to a screen printing device and a screen printing method which print paste such as cream solder or conductive paste on a board.

BACKGROUND ART

In an electronic component mounting step, screen printing is used as a method of printing paste such as cream solder or conductive past on a board. In this method, a squeegeeing operation of supplying paste on a screen mask below which the board is set and sliding a squeegee is repeatedly performed. In this squeegeeing operation, the paste is raked up in the traveling direction of the squeegee and is gradually pushed outwards along the surface of the squeegee. The paste which is moved beyond the width dimension of the board remains in this range without being raked up by the squeegee due to the bending of the screen mask, and attaches onto the top surface of the screen mask, and dries, hardens and deposits over time. In order to prevent low printing quality due to the deposits of the paste on the screen mask, a screen printing device is known which is constructed to provide a blocking and stopping member to prevent the paste from being overflown beyond the printing width in the squeegeeing (refer to a patent document 1).

RELATED ART DOCUMENTS

Patent Document

Patent document 1: Japan Patent Publication No. 2003-220687

SUMMARY OF THE INVENTION

Problems to be Solved by the Invention

However, in the related art shown in the above-mentioned patent document, there are the following problems due to the blocking and stopping mechanism for preventing the overflow. That is, to block the overflow of the paste effectively, it is necessary to press the screen mask with a pressing force enough to seal a leakage of the paste between the screen mask and the blocking and stopping mechanism. However, because the under surface of the screen mask in the part where the blocking and stopping member is pressed is free, a bending of the screen mask occurs when the blocking and stopping member is pressed with an adequate pressing force, and the coherency of the screen mask and the board is ruined due to the bending, and as a result a normal print quality is impaired. When it is assumed to prevent the problem due to the deposits of the paste on the screen mask, it is obliged to perform a maintenance work of detaching the squeegee or the blocking and stopping member and removing and cleaning the attached paste by hands to reduce the deposits as much as possible, and it is expected to reduce the time and labor.

Thus, the object of the present invention is to provide a screen printing device and a screen printing method so that the time and labor of the maintenance can be decreased by preventing deposits of the paste on the screen mask.

Means for Solving the Problems

A screen printing device of the present invention, which prints paste by making a board to abut against a screen mask provided with a pattern hole, comprise a board positioning part which positions the board, which is imported in a first direction from upstream, to a predetermined position by moving the board in a horizontal direction and in an up and down direction relatively in a state that the board is sandwiched and clamped by a pair of clamping members from a second direction that is perpendicular to the first direction, a screen printing part which prints the paste on the board through the pattern hole by sliding a squeegee in the second direction on the screen mask to which the paste is supplied and against which the board abuts from below, and a mask supporting member disposed in the second direction at the two ends in the first direction of the pair of clamping members so as to form a rectangle frame together with the clamping members, and which supports the screen mask from below in a state that the board abuts against the under surface of the screen mask.

A screen printing method of the present invention, which prints paste by making a board to abut against a screen mask which is provided with a pattern hole, comprises a board positioning step which positions the board, which is imported in a first direction from upstream, to a predetermined position by moving the board in a horizontal direction and in an up and down direction relatively in a state that the board is sandwiched and clamped by a pair of clamping members from a second direction which is perpendicular to the first direction; and a screen printing step which prints the paste on the board through the pattern hole by sliding a squeegee in the second direction on the screen mask to which the paste is supplied and against which the board abuts from below, wherein, in the screen printing step, the screen mask is supported from below by a mask supporting member disposed in the second direction at the two ends in the first direction of the pair of clamping member so as to form a rectangle frame together with the clamping members.

Effect of the Invention

According to the present invention, at the two ends of the pair of clamping members which sandwich and clamp the board, the mask supporting members forming a rectangle frame together with the clamping members are disposed, and the screen mask is supported from below by the mask supporting members in a state that the board abuts against the under surface of the screen mask. Thereby, the downwards bending of the screen mask can be prevented, and the time and labor of maintenance can be decreased by preventing the deposits of the paste on the screen mask that occur due to the bending.

EMBODIMENTS OF THE INVENTION

Figure 1:
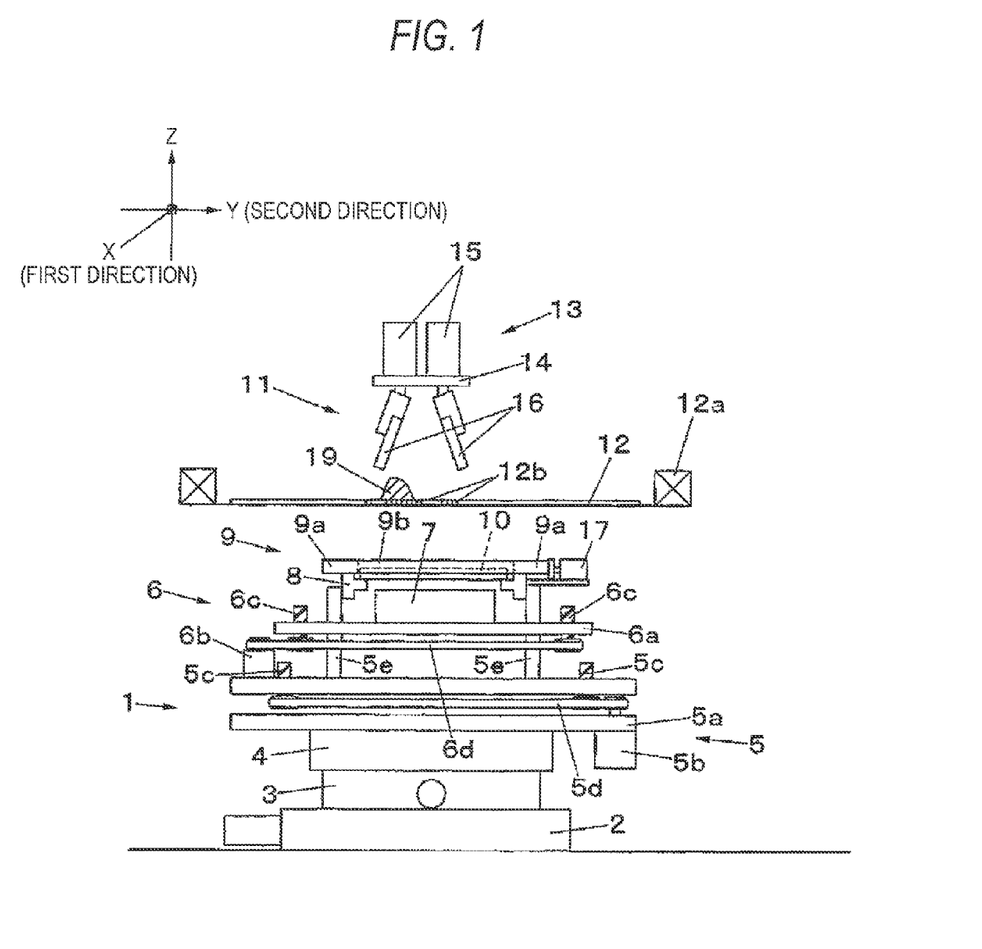
FIG. 1 is a side view of a screen printing device of one embodiment of the present invention.

Next, an embodiment of the invention is described with reference to the figures. First, with reference to FIGS. 1, 2 and 3, the construction of a screen printing device is described. In FIG. 1, the screen printing device is constructed by disposing a screen printing part 11 above a board positioning part 1. The board positioning part 1 is constructed by stacking a Y axis table 2, an X axis table 3 and a θ axis table 4, and further combining a first Z axis table 5 and a second Z axis table 6 thereon.

The construction of the first Z axis table 5 is described. Above a horizontal base plate 4a, which is provided on the top surface of the θ axis table 4, a similarly horizontal base plate 5a is held by an elevation guide mechanism (not shown in the figures) to be elevatable. The base plate 5a is elevated by a Z axis elevating mechanism which is so constructed that a plurality of forwarding screws 5c are rotationally driven through a belt 5d by a motor 5b.

Figure 2:
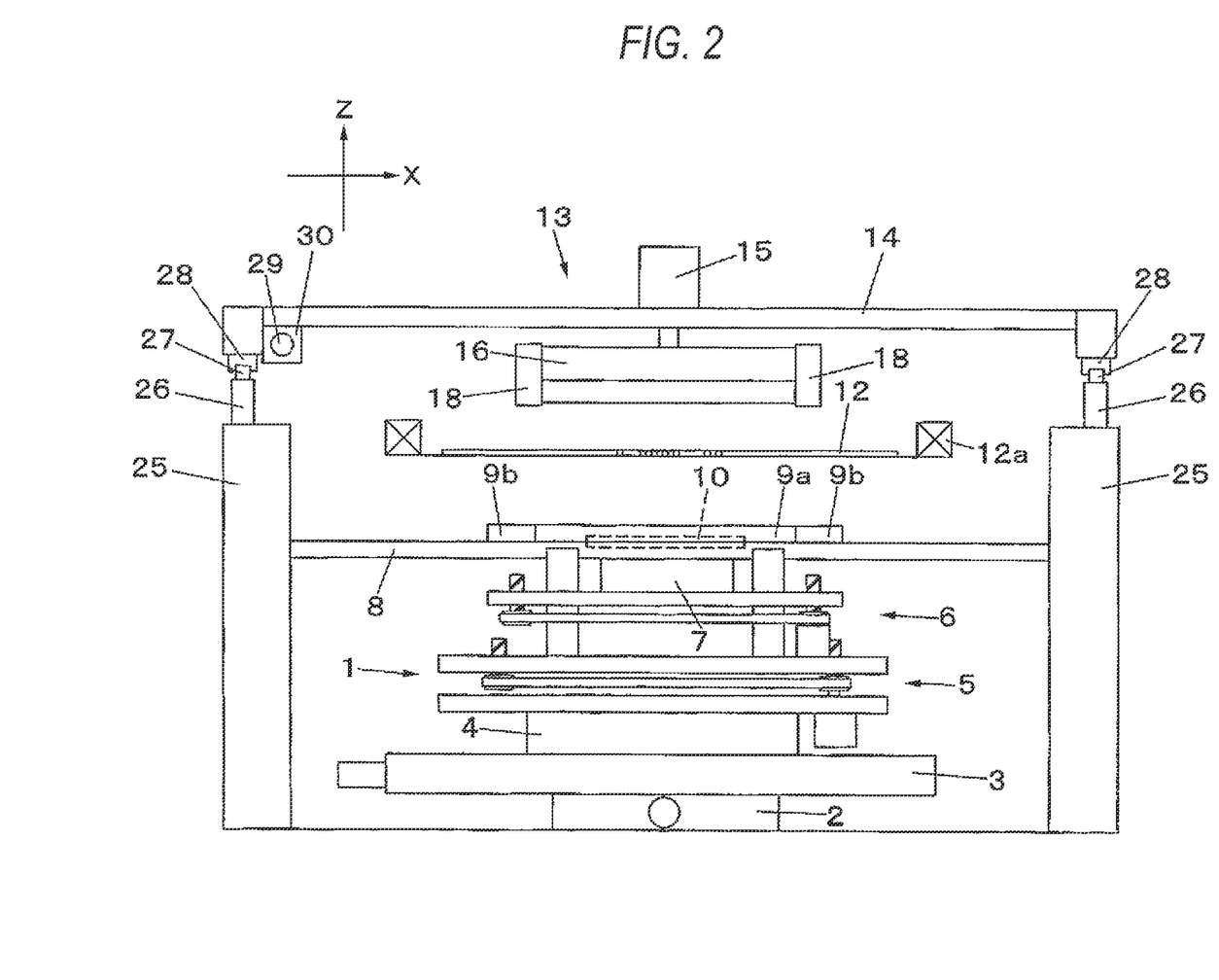
FIG. 2 is a front view of the screen printing device of the embodiment of the present invention.
Figure 3:
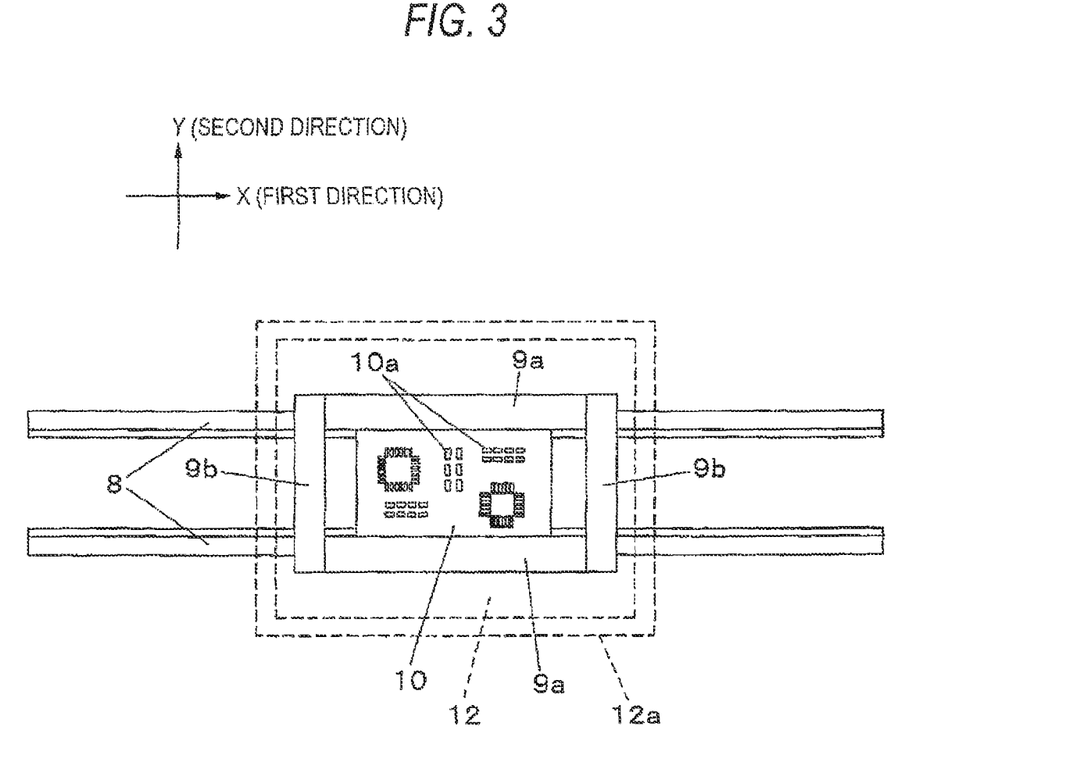
FIG. 3 is a top view of the screen printing device of the embodiment of the present invention.

Vertical frames 5e are raised on the base plate 5a, and a board conveying mechanism 8 is held at the upper ends of the vertical frames 5e. The board conveying mechanism 8 includes two conveyance rails which are disposed in parallel with a board conveying direction (X direction (first direction), or a direction perpendicular to the paper plane in FIG. 1), and both ends of a board 10 for the printing are supported and conveyed by these conveyance rails. By driving the first Z axis table 5, the board 10 which is held by the board conveying mechanism 8, can be elevated relative to a screen printing part 11 to be described below together with the board conveying mechanism 8. As shown in FIGS. 2 and 3, the board conveying mechanism 8 extends towards an upstream side (left in FIGS. 2 and 3) and a downstream side, and the board 10 imported from upstream is conveyed by the board conveying mechanism 8, and is further positioned by the board positioning part 1. The board 10, after the printing is performed by the screen printing part 11 to be described below, is exported to the downstream side by the board conveying mechanism 8.

The construction of the second Z axis table 6 is described. Between the board conveying mechanism 8 and the base plate 5a, a horizontal base plate 6a is disposed to be elevatable along an elevation guide mechanism (not shown in the figures). The base plate 6a is elevated by a Z axis elevating mechanism which is so constructed that a plurality of forwarding screws 6c are rotationally driven through a belt 6d by a motor 6b. On the top surface of the base plate 6a, a board supporting part 7, in which a supporting surface which holds the board 10 is provided on the top surface, is disposed.

By driving the second Z axis table 6, the board supporting part 7 is elevated relative to the board 10 which is held on the board conveying mechanism 8. The board supporting part 7 supports the board 10 from below when the supporting surface of the board supporting part 7 abuts against the under surface of the board 10. A clamping mechanism 9 is disposed on the top surface of the board conveying mechanism 8. The clamping mechanism 9 includes two clamping members 9a which are arranged to be left-right opposed to each other, and when one clamping member 9a is moved back and forth by a driving mechanism 17, the board 10 is clamped and fixed from both sides in the Y direction (second direction) (refer to FIG. 3).

That is, the board positioning part 1 positions the board 10, which is imported in the first direction from upstream, to a predetermined position for a printing operation of the screen printing part 11 by moving the board 10 in the horizontal direction and in the up and down direction relatively in a state that the board 10 is sandwiched and clamped by the pair of clamping members 9a from a second direction which is perpendicular to the first direction.

As shown in FIG. 3, at the two ends in the X direction of the pair of clamping members 9a, mask supporting members 9b of a slim board shape are held and disposed on a frame member of the board conveying mechanism 8, respectively. These mask supporting members 9b form a rectangular frame around the board 10 together with the pair of clamping members 9a, and its are set so that the top surface of the clamping members 9a and the top surface of the mask supporting members 9b are on the same height level. When the board 10 abuts against the under surface of the screen mask 12, the mask supporting members 9b support the screen mask 12 from below together with the clamping members 9a.

Thereby, the screen mask 12 is prevented from bending downwards in the squeegeeing, and as described later, the problems such as the deposits of the cream solder 19 on the top surface of the screen mask 12 due to the bending of the screen mask 12 can be prevented. For this purpose, the disposing positions in the X direction of the mask supporting members 9b are set at positions including a width range of the squeegees 16 in the screen printing part 11 as described below. Further, the dimensions in the Y direction of the mask supporting members 9b are set to dimensions to make the above-mentioned rectangle frame to be formed in a state that the board 10 of the largest width size for the printing is clamped by the clamping members 9a.

Next, the screen printing part 11, which is disposed above the board positioning part 1, is described. In FIGS. 1 and 2, a screen mask 12 is expanded to a mask frame 12a, and the screen mask 12 is provided with pattern holes 12b corresponding to the shapes and positions of electrodes 10a which are to be printed on the board 10 (refer to FIG. 3). A squeegee unit 13 is disposed above the screen mask 12. The squeegee unit 13 is so constructed that squeegee elevating mechanisms 15 are disposed on a horizontal plate 14 to make squeegees 16 to be elevated.

The squeegees 16 are elevated by driving the squeegee elevating mechanisms 15 to abut against the top surface of the screen mask 12 to which the cream solder 19, which is paste, is supplied. As shown in FIG. 2, at the two ends in the X direction of the squeegees 16, blocking and stopping members 18 are installed, respectively. The blocking and stopping members 18 have a function of blocking and stopping the cream solder 19 so that the cream solder 19 will not be overflown beyond the width range of the squeegees 16 in a squeegeeing operation described below. The positions in the Y direction of the blocking and stopping members 18 are provided to generally correspond to the positions in the Y direction of the mask supporting members 9b which are located below.

As shown in FIG. 2, guide rails 27 are disposed in the Y direction on brackets 26 which are placed on a vertical frame 25, and sliders 28, which are slidably fitted with the guide rails 27, are coupled to two ends of the plate 14. Thereby, the squeegee unit 13 becomes slidable in the Y direction. The plate 14 is horizontally moved in the Y direction by a squeegee moving means that includes a nut 30, a forwarding screw 29 and a squeegee moving motor (not shown in the figure) which rotationally drives the forwarding screw 29. Thereby, a squeegeeing operation of horizontally moving the squeegees 16 in a state that the squeegees 16 abut against the screen mask 12 is performed.

Next, a screen printing method performed by the screen printing part 11 in the above-mentioned screen printing device is described. First, the board 10 imported in the X direction by the board conveying mechanism 8 from upstream is sandwiched and clamped from the Y direction by the pair of clamping members 9a. In this state, by driving the board positioning part 1 to move the board 10 relative to the screen printing part 11 in the horizontal direction and in the up and down direction, the board 10 is positioned to a predetermined printing position of the screen printing part 11 (board positioning step).

Thereby, in the squeegeeing of the squeegee unit 13, the horizontal position of the board 10 is fixed. In this state, by making the squeegees 16 slide in the Y direction (second direction) on the screen mask 12 to which the cream solder 19 is supplied and against which the board 10 abuts from below, the cream solder 19 is printed on the board 10 through the pattern holes 12b (printing step).

Figure 4:
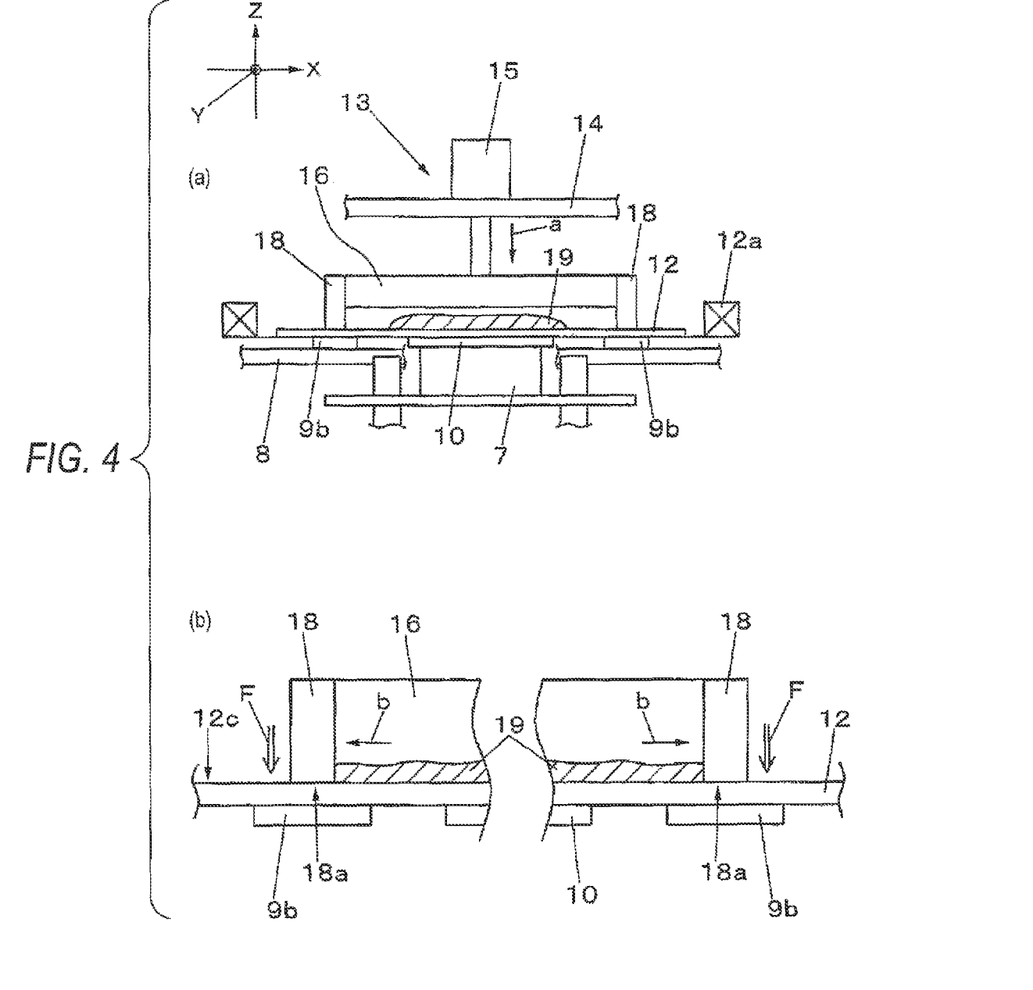
FIGS. 4(a) and 4(b) are operational illustrations of a screen printing device of one embodiment of the present invention.

Then, with reference to FIGS. 4(a) and 4(b), functions of the blocking and stopping members 18 and the mask supporting members 9b in the above-described printing step are described. FIG. 4(a) shows that by operating the squeegee elevating mechanism 15 in the squeegee unit 13 to drop the squeegees 16 (arrow a), the lower ends of the squeegees 16 abut against the screen mask 12. At this time, the blocking and stopping members 18 which are installed at the two ends of the squeegees 16 are located above the top surface of the mask supporting members 9h through the screen mask 12. In the squeegeeing, the squeegees 16 are pushed relative to the screen mask 12 by the squeegee elevating mechanism 15 with a predetermined printing pressure, and are moved reciprocatively in the Y direction (a direction perpendicular to the paper plane).

In the squeegeeing, as shown in FIG. 4(b), the behavior of the cream solder 19 to gradually move in the widthwise direction (X direction) of the squeegees 16 as well as the squeegeeing direction that the squeegees 16 move is shown (arrow b). In this way, even if the movement in the widthwise direction of the cream solder 19 occurs, as shown in the present embodiment, the flow of the cream solder 19 is blocked and stopped by the blocking and stopping members 18, and it is prevented to expand beyond the width of the squeegees 16.

The blocking and stopping effect at this time depends on a seal force F of the under surfaces 18a of the blocking and stopping members 18 which are pressed to the top surface 12c of the screen mask 12. In this embodiment, because the under surface of the screen mask 12, which is located below the blocking and stopping members 18, is supported by the mask supporting members 9b, even if an adequate pressing force is given to the squeegees 16 by the squeegee elevating mechanism 15, the downwards bending of the screen mask 12 or the deformation of the board 10 will not occur, and it is possible to secure a sufficient printing power F. Thereby, the cream solder 19 is blocked and stopped surely by the blocking and stopping members 18, and will not be expanded to the area where a bending is easy to occur because the bottom side of the screen mask 12 is not supported. Therefore, the problem due to the deposits of the cream solder 19 on the top surface of the screen mask 12 due to the bending of the screen mask 12 can be prevented.

Figure 5:
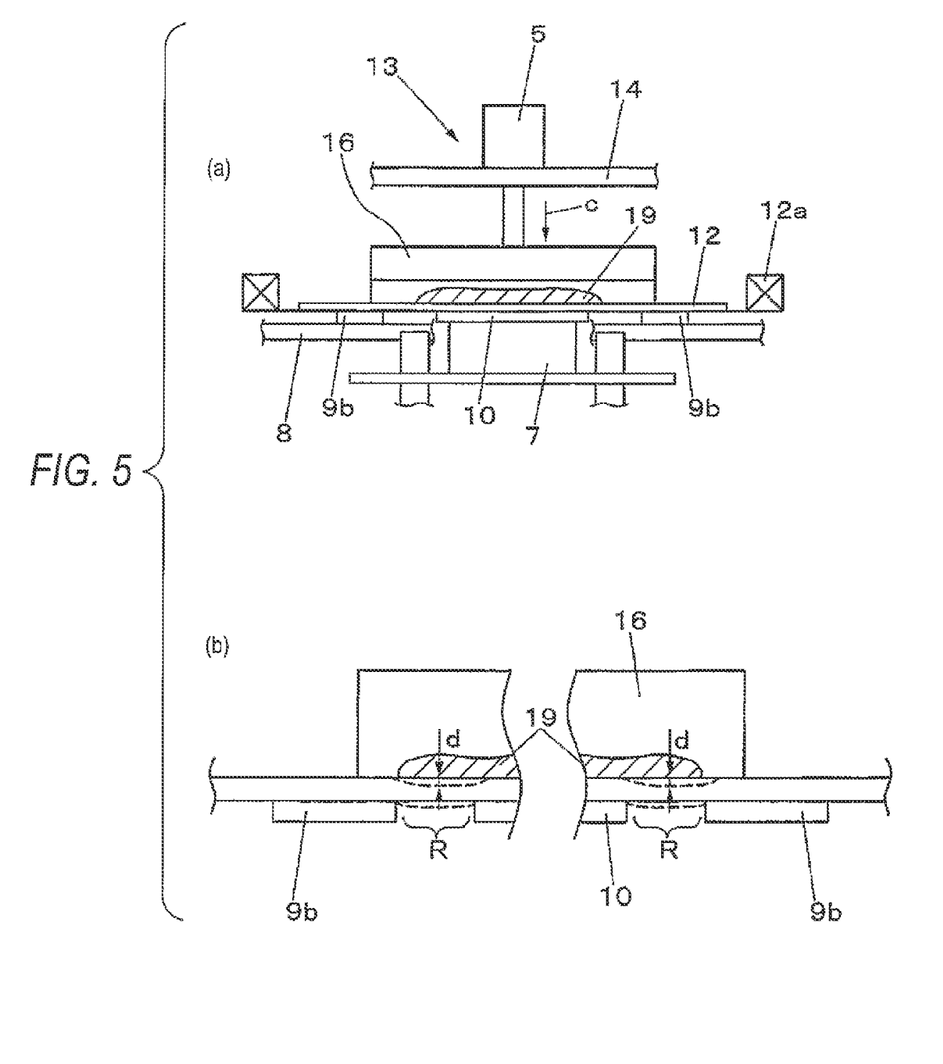
FIGS. 5(a) and 5(b) are operational illustrations of a screen printing device of another embodiment of the present invention.

In the above-mentioned embodiment, an example is shown that the blocking and stopping members 18 are installed at the two ends of the squeegees 16, but the blocking and stopping members 18 are not necessarily provided. As shown in FIGS. 5(a) and 5(b), even if only the mask supporting members 9b alone are included, the problem due to the deposits of the cream solder 19 on the top surface of the screen mask 12 can be decreased. Like FIG. 4(a), FIG. 5(a) shows that by operating the squeegee elevating mechanism 15 in the squeegee unit 13 to drop the squeegees 16 (arrow c), the lower ends its of the squeegees 16 abut against the screen mask 12. In the squeegeeing, the squeegees 16 are pushed relative to the screen mask 12 by the squeegee elevating mechanism 15 with a predetermined printing pressure, and are moved reciprocatively in the Y direction (a direction perpendicular to the paper plane).

In the squeegeeing, the printing pressures of the squeegees 16 act on the top surface of the screen mask 12, but, in the present embodiment mode, the mask supporting members 9b which have shapes to form a rectangular frame together with the clamping members 9a support the under surface of the screen mask 12. Herein, as shown in FIG. 5(b), although a nonsupport area R exists between the mask supporting members 9b and the board 10 in the under surface of the screen mask 12, because the screen mask 12 is supported in a state of tightly contacting with the top surfaces of the mask supporting members 9b and the board 10, there is a very small bending amount d to be produced in the nonsupport area R. Therefore, the deposits of the cream solder 19 due to the bending of the screen mask 12 can be largely decreased.

As described above, in the screen printing device and the screen printing method shown in the present embodiment, at the two ends of the pair of clamping members 9a which sandwich and clamp the board 10, the mask supporting members 9b forming a rectangle frame together with the clamping members 9a are disposed, and the screen mask 12 is supported from below by the mask supporting members 9b in a state that the board 10 abuts against the under surface of the screen mask 12.

Thereby, it is possible to reduce the problems in the related art, for its example, the troublesome operations that needs time and labor, such as a maintenance operation which is required in a way of sliding the position of the blocking and stopping member in the squeegee according to the board size, that is, detaching and taking out the blocking and stopping member to remove and clean the dried and attached paste due to the use.

This application is based on the Japanese patent application (patent application 2011-161683) filed on Jul. 25, 2011, whose content is incorporated herein by reference.

INDUSTRIAL APPLICABILITY

The screen printing device and the screen printing method of the present invention prevent deposits of paste on a screen mask, have a feature that the time and labor of maintenance can be decreased, and are useful in the field of screen printing to print paste such as cream solder or conductive paste on a board.

DESCRIPTION OF THE NUMBERS 1 board positioning part
8 the board conveying mechanism
9 clamping mechanism
9a clamping member
9b mask supporting member
10 board
11 screen printing part
12 screen mask
12b pattern hole
13 squeegee unit
16 squeegee
19 cream solder

The invention claimed is:

1. A screen printing device which prints paste by making a board to abut against a screen mask provided with a pattern hole, comprising a board positioning part which positions the board, which is imported in a first direction from upstream, to a predetermined position by moving the board in a horizontal direction and in an up and down direction relatively in a state that the board is sandwiched and clamped by a pair of clamping members from a second direction that is perpendicular to the first direction, a screen printing part which prints the paste on the board through the pattern hole by sliding a squeegee in the second direction on the screen mask to which the paste is supplied and against which the board abuts from below, a pair of blocking and stopping members disposed at two ends of the squeegee, and which block and stop the paste from being overflown beyond a range of the squeegee, and a pair of mask supporting members disposed in the second direction at the two ends in the first direction of the pair of clamping members so as to form a rectangle frame together with the clamping members, and which support the screen mask from below in a state where the blocking and stopping members abut against a top surface of the screen mask over the mask supporting members, wherein the blocking and stopping members are located above the top surface of the mask supporting members through the screen mask.

2. A screen printing method which prints paste by making a board to abut against a screen mask which is provided with a pattern hole, comprising a board positioning step which positions the board, which is imported in a first direction from upstream, to a predetermined position by moving the board in a horizontal direction and in an up and down direction relatively in a state that the board is sandwiched and clamped by a pair of clamping members from a second direction which is perpendicular to the first direction; and a screen printing step which prints the paste on the board through the pattern hole by sliding a squeegee in the second direction on the screen mask to which the paste is supplied and against which the board abuts from below, wherein, in the screen printing step, the paste is blocked and stopped from being overflown beyond a range of the squeegee by a pair of blocking and stopping members disposed at two ends of the squeegee, and the screen mask is supported from below by a pair of mask supporting members disposed in the second direction at the two ends in the first direction of the pair of clamping member in a state where the blocking and stopping members abut against a top surface of the screen mask over the mask supporting members so as to form a rectangle frame together with the clamping members, wherein the blocking and stopping members are located above the top surface of the mask supporting members through the screen mask.

\* \* \* \* \*